(12) United States Patent
Crandall et al.

(10) Patent No.: US 11,649,652 B2
(45) Date of Patent: May 16, 2023

(54) BARRIER ACCESS FOR AUTONOMOUS VEHICLE

(71) Applicants: Justin Crandall, Dallas, TX (US); Bart M. Lomont, Dallas, TX (US); David J. Melbourne, Arlington, TX (US)

(72) Inventors: Justin Crandall, Dallas, TX (US); Bart M. Lomont, Dallas, TX (US); David J. Melbourne, Arlington, TX (US)

(73) Assignee: Robin Technologies, Inc., Dallas, TX (US)

( * ) Notice: Subject to any disclaimer, the term of this patent is extended or adjusted under 35 U.S.C. 154(b) by 1238 days.

(21) Appl. No.: 16/172,059

(22) Filed: Oct. 26, 2018

(65) Prior Publication Data

US 2019/0136563 A1 May 9, 2019

Related U.S. Application Data

(60) Provisional application No. 62/582,496, filed on Nov. 7, 2017, provisional application No. 62/582,488, filed on Nov. 7, 2017.

(51) Int. Cl.
*G08B 13/08* (2006.01)
*E04H 6/42* (2006.01)
(Continued)

(52) U.S. Cl.
CPC .......... *E04H 6/422* (2013.01); *A01D 34/008* (2013.01); *E04H 6/426* (2013.01); *E05B 47/00* (2013.01);
(Continued)

(58) Field of Classification Search
CPC .......... E04H 6/422; E04H 6/426; E05F 15/76; E05F 15/79; A01D 34/008; E05B 47/00;
(Continued)

(56) References Cited

U.S. PATENT DOCUMENTS 3,617,962 A * 11/1971 Wilson ................. B65G 47/496
335/151
3,683,328 A * 8/1972 Fayling ..................... G01P 3/60
340/902

(Continued)

OTHER PUBLICATIONS

De la Hoya et al., Wireless Magnetic Sensor Node for Vehicle Detection With Optical Wake-Up (Year: 2011).*

(Continued)

*Primary Examiner* — Quang Pham
(74) *Attorney, Agent, or Firm* — Dan Brown Law Office; Daniel R. Brown

(57) ABSTRACT

Access control for an autonomous vehicle through a door in a doorway. A magnet is attached to the autonomous vehicle and a magnetometer is located some distance from the doorway. The magnetometer outputs a magnetometer signal in response to detecting the magnet, which causes the transmitter to transmit a detection signal. A doorway device is fixed about the doorway, and includes a receiver, and a locking mechanism with a locking pin. The doorway device retracts the pin to unlock the door for a predetermined period of time in response to receipt of the detection signal, and extents the pin to lock the door after the predetermined period of time ends.

18 Claims, 3 Drawing Sheets

(51) Int. Cl.
  E05B 65/00 (2006.01)
  E05B 47/00 (2006.01)
  E05F 15/76 (2015.01)
  E05F 15/79 (2015.01)
  G01V 3/08 (2006.01)
  G05D 1/02 (2020.01)
  G01R 33/02 (2006.01)
  A01D 34/00 (2006.01)

(52) U.S. Cl.
  CPC ...... *E05B 47/0038* (2013.01); *E05B 65/0021* (2013.01); *E05F 15/76* (2015.01); *E05F 15/79* (2015.01); *G01R 33/0206* (2013.01); *G01V 3/081* (2013.01); *G05D 1/0265* (2013.01); *E05B 2047/0067* (2013.01); *E05Y 2400/445* (2013.01); *E05Y 2900/106* (2013.01); *G05D 2201/0208* (2013.01)

(58) Field of Classification Search
  CPC ............ E05B 47/0038; E05B 65/0021; E05B 2047/0067; G01R 33/0206; G01V 3/081; G05D 1/0265; G05D 2201/0208; E05Y 2400/445; E05Y 2900/106
  See application file for complete search history.

(56) References Cited

U.S. PATENT DOCUMENTS

| | | | | |
|---|---|---|---|---|
| 3,753,223 | A * | 8/1973 | Fayling | G08G 1/01 340/905 |
| 3,933,099 | A * | 1/1976 | Sieb | B61L 27/04 246/5 |
| 4,168,760 | A * | 9/1979 | Paul, Jr. | G08G 1/00 318/587 |
| 4,777,785 | A * | 10/1988 | Rafaels | A01D 34/74 56/DIG. 15 |
| 5,023,790 | A * | 6/1991 | Luke, Jr. | G05B 19/41865 318/587 |
| 5,957,397 | A * | 9/1999 | Kelly | B02C 19/0068 241/24.22 |
| 6,002,332 | A * | 12/1999 | King | G07C 9/00309 340/941 |
| 6,164,015 | A * | 12/2000 | Kawanobe | E05F 15/646 49/360 |
| 6,448,894 | B1 * | 9/2002 | Desai | G07C 9/00309 340/426.36 |
| 6,593,856 | B1 * | 7/2003 | Madau | G05B 19/0428 340/12.27 |
| 6,851,290 | B1 * | 2/2005 | Meier | E05B 47/026 292/DIG. 60 |
| 7,047,774 | B1 * | 5/2006 | Gogel | E05B 65/0021 70/32 |
| 7,240,524 | B1 * | 7/2007 | White | E05B 65/0021 70/279.1 |
| 8,532,822 | B2 * | 9/2013 | Abramson | A01D 34/008 367/105 |
| 8,845,125 | B1 * | 9/2014 | Lumsden | B61L 29/04 362/249.02 |
| 8,938,318 | B2 * | 1/2015 | Bergstrom | G05D 1/0278 701/25 |
| 8,965,561 | B2 * | 2/2015 | Jacobus | G05D 1/0274 700/229 |
| 9,788,481 | B2 * | 10/2017 | Das | A01D 34/008 |
| 10,444,760 | B2 * | 10/2019 | Grufman | G05D 1/0234 |
| 10,534,331 | B2 * | 1/2020 | Quam | G08B 5/36 |
| 10,551,844 | B2 * | 2/2020 | Biber | G05D 1/0221 |
| 10,767,383 | B2 * | 9/2020 | Crandall | E05F 15/79 |
| 2004/0163318 | A1 * | 8/2004 | Sato | E05F 15/70 49/280 |
| 2005/0056062 | A1 * | 3/2005 | Gogel | E05B 67/38 70/56 |
| 2006/0202815 | A1 * | 9/2006 | John | G08B 21/14 340/5.71 |
| 2008/0236214 | A1 * | 10/2008 | Han | E05B 47/0012 70/129 |
| 2011/0203333 | A1 * | 8/2011 | Jimenez | E05B 63/0017 70/95 |
| 2012/0029752 | A1 * | 2/2012 | Johnson | B60L 53/65 901/1 |
| 2012/0029753 | A1 * | 2/2012 | Johnson | B60L 15/2036 701/23 |
| 2012/0029754 | A1 * | 2/2012 | Thompson | B60L 15/20 901/1 |
| 2012/0029755 | A1 * | 2/2012 | Johnson | G05D 1/0219 701/26 |
| 2012/0029756 | A1 * | 2/2012 | Johnson | G05D 1/0265 701/26 |
| 2012/0227915 | A1 * | 9/2012 | Rodriguez | E05B 65/0021 160/202 |
| 2013/0025248 | A1 * | 1/2013 | Kraft | A01D 34/008 701/25 |
| 2013/0117078 | A1 * | 5/2013 | Weik, III | G06Q 10/00 705/13 |
| 2013/0205736 | A1 * | 8/2013 | Maruyama | B60L 15/2036 56/12.9 |
| 2015/0146001 | A1 * | 5/2015 | White | E01F 13/06 348/149 |
| 2015/0189830 | A1 * | 7/2015 | Jagenstedt | B60L 15/20 901/1 |
| 2015/0281658 | A1 * | 10/2015 | Lee | H04N 5/23206 348/211.1 |
| 2015/0328775 | A1 * | 11/2015 | Shamlian | A01D 34/008 901/1 |
| 2016/0025821 | A1 * | 1/2016 | Widmer | B60L 53/122 324/258 |
| 2017/0043967 | A1 * | 2/2017 | Walford | B65G 69/003 |
| 2017/0044816 | A1 * | 2/2017 | Salter | E05F 15/73 |
| 2017/0101278 | A1 * | 4/2017 | Stone | B65G 69/2811 |
| 2017/0109942 | A1 * | 4/2017 | Zivkovic | G07B 15/04 |
| 2017/0234033 | A1 * | 8/2017 | DeBoer | E05C 3/046 49/449 |
| 2017/0332055 | A1 * | 11/2017 | Henderson | G07C 9/00174 |
| 2017/0351265 | A1 * | 12/2017 | Eagling | G05D 1/0265 |
| 2018/0061145 | A1 * | 3/2018 | Blustein | E05F 15/76 |
| 2018/0170347 | A1 * | 6/2018 | Kim | B60W 30/18127 |
| 2018/0241394 | A1 * | 8/2018 | Virnich | E05F 15/70 |
| 2019/0016312 | A1 * | 1/2019 | Carlson | G05D 1/0088 |
| 2019/0016331 | A1 * | 1/2019 | Carlson | G05D 1/0088 |
| 2019/0016384 | A1 * | 1/2019 | Carlson | G05D 1/0088 |
| 2019/0137305 | A1 * | 5/2019 | Karabacak | G01D 5/353 |
| 2019/0234110 | A1 * | 8/2019 | Laporta | E05B 41/00 |
| 2020/0043247 | A1 * | 2/2020 | Takahashi | G08G 1/09 |
| 2020/0250896 | A1 * | 8/2020 | Vossoughi | H04W 4/24 |

OTHER PUBLICATIONS

Lou et al., A Novel Vehicle Detection Method Based on the Fusion of Radio Received Signal Strength and Geomagnetism (Year: 2019).*

* cited by examiner

BARRIER ACCESS FOR AUTONOMOUS VEHICLE

RELATED APPLICATIONS

This disclosure claims priority to U.S. provisional patent application Ser. No. 62/582,488 filed on Nov. 7, 2017 and U.S. provisional patent application Ser. No. 62/582,496 filed on Nov. 7, 2017.

BACKGROUND OF THE INVENTION

Field of the Invention

The present disclosure generally relates to a system and method for detecting the presence of certain vehicles, including robotic lawnmowers, and selectively permitting the vehicle to pass through a barrier.

Description of the Related Art

In housing and business developments, a properly kept lawn is desirable, can increase property values, and may actually be required under various association rules. Maintaining a grass lawn requires frequent mowing. Lawn mowing has traditionally been conducted by various types of powered and unpowered lawnmowers. In recent years, robotic mowers have been increasingly utilized by homeowners, renters, governments, business owners, and property owners. Robotic mowers automatically mow one or more sections of grass. Robotic mowers are controlled by a guidance system, and are programmable according to certain schedules, functions, and lawn areas. Different lawn areas may be separated from each other by a physical barrier, such as walls, fences, hedgerows, and such, which have an opening therein through which a robotic mower may pass. Commonly, such an opening, or doorway, may include a door or gate that is installed to limit access for people, animals, debris, and for general security purposes. While robotic mowers are designed to operate in various areas and along various pathways, a system for detecting a robotic mower and selectively allowing the robotic mower to pass through a barrier while preventing animals, debris or intruders from passing through the barrier does not exist.

Thus, it can be appreciated that there is a need in the art for systems and methods for detecting the presence of certain vehicles, including robotic lawnmowers, and selectively permitting the vehicle to pass through a barrier, including operation of a door in a doorway. Note that the description provided in this Background section should not be assumed to be prior art merely because it is mentioned in or associated with this Background section. This Background section may include information that describes one or more aspects of the subject technology.

SUMMARY OF THE INVENTION

The need in the art is address by the teachings of the present disclosure. The present disclosure teaches a system for controlling access by an autonomous vehicle through a door in a doorway. The system includes a magnet attached to the autonomous vehicle and a magnetometer located some distance from the doorway, and also coupled to a transmitter. The magnetometer outputs a magnetometer signal in response to detecting the magnet, which causes the transmitter to transmit a detection signal. A doorway device is fixed about the doorway, and further includes a receiver, corresponding to the transmitter, and a locking mechanism that has a pin that is selectively extendable and retractable to lock and unlock the door, respectively. The doorway device retracts the pin to unlock the door for a predetermined period of time in response to receipt of the detection signal, and the doorway device later extents the pin to lock the door after the predetermined period of time.

In a specific embodiment of the foregoing system, the predetermined period of time begins as a function of the distance the magnetometers is from the doorway and the speed of travel of the autonomous vehicle, which is selected to retract the pin prior to arrival of the autonomous vehicle at the door. The predetermined period of time duration is selected so that the pin is extended after the autonomous vehicles, traveling at the speed of travel, has passed through the door. In a refinement to this embodiment, where the door is coupled to the doorway by a hinge, the autonomous vehicle engages the door and pushes it open as it passes through the doorway, and the predetermined period of time is further selected to extend the pin after the door returns to a closed position.

In a specific embodiment of the foregoing system, the magnetometer signal is proportional to the distance between the magnet and the magnetometer, and the magnetometer signals are further compared over time to determined when the magnet is within twelve inches from the magnetometer, to thereby transmit the detection signal and initiate the predetermined period of time. In another specific embodiment, the magnetometer signal includes X, Y, and Z dimension components, and the X, Y, and Z dimension components are compared over time to detect the presence of the magnet.

In a specific embodiment of the foregoing system, where the autonomous vehicle follows plural guide wires embedded in the ground, the system further includes a perimeter switch controller coupled to receive the detection signal, which is responsive thereto to switch among the plural guide wires to direct the autonomous vehicle through the doorway. In a refinement to this embodiment, the magnetometer is buried in the earth adjacent one of the plural guide wires that the autonomous vehicle follows.

The present disclosure also teaches a system for access control for an autonomous vehicle through a door in a doorway. This embodiment includes a magnet attached to the autonomous vehicle and a magnetometer located a distance from the doorway, and also coupled to a transmitter. The magnetometer outputs a magnetometer signal in response to the magnet, which causes the transmitter to transmit a detection signal. A doorway device is fixed around the doorway, and has a receiver corresponding to the transmitter. The doorway device is coupled to open the door for a predetermined period of time in response to receipt of the detection signal by the receiver, and the doorway device closes the door after the predetermined period of time.

In a specific embodiment of the foregoing system, the predetermined period of time begins as a function of the distance and a speed of travel of the autonomous vehicle, and is also selected to open the door prior to arrival of the autonomous vehicle at the door. Also, the predetermined period of time duration is selected to close the door after the autonomous vehicle, traveling at the speed of travel, has passed through the door.

In a specific embodiment of the foregoing system, the magnetometer signal is proportional to the distance between the magnet and the magnetometer, and the magnetometer signals are compared over time to determined when the magnet is within twelve inches from the magnetometer, to thereby transmit the detention signal and initiate the predetermined period of time.

In a specific embodiment of the foregoing system, where the autonomous vehicle follows plural guide wires embedded in the ground, the system further includes a perimeter switch controller that receives the detection signal, and is responsive thereto to switch among the plural guide wires to direct the autonomous vehicle through the doorway. In a refinement to this embodiment, the magnetometer is buried in the earth adjacent one of the plural guide wires that the autonomous vehicle follows.

The present disclosure also teaches a method for controlling access by an autonomous vehicle, which has a magnet attached thereto, through a door in a doorway that has a doorway device fixed thereto. The doorway device including a receiver and a locking mechanism with a selectively operable locking pin, and, a magnetometer positioned a distance from the doorway, which is coupled to a transmitter corresponding to the receiver. The method includes outputting a magnetometer signal from the magnetometer to the transmitter in response to the presence of the autonomous vehicle and magnet being near the magnetometer, then, transmitting a detection signal from the transmitter in response to the magnetometer signal. And, retracting the locking pin by the doorway device for a predetermined period of time in response to receiving the detection signal, thereby unlocking the door, and, extending the locking pin to lock the door at the end of the predetermined period of time.

In a specific embodiment, the foregoing method further includes beginning the predetermined period of time as a function of the distance and a speed of travel of the autonomous vehicle, which is selected to retract the pin prior to arrival of the autonomous vehicle at the doorway, and, ending the predetermined period of time and extending the pin to lock the door after the autonomous vehicle, traveling at the speed of travel, has passed through the doorway. In a refinement to this embodiment, where the door is coupled to the doorway by a hinge, the method further includes pushing the door open by the autonomous vehicle as it passes through the doorway, and, further selecting the duration of the predetermined period of time, thereby extending the pin after the door returns to a closed position.

In a specific embodiment of the foregoing method, where the magnetometer signal is proportional to the distance between the magnet and the magnetometer, the method further includes comparing magnetometer signals over time, thereby determining when the magnet is within twelve inches of the magnetometer, and thereby initiating the predetermined period of time.

In a specific embodiment of the foregoing method, where the autonomous vehicle follows plural guide wires embedded in the ground, and wherein a perimeter switch controller is coupled to receive the detection signal, the method further includes switching among the plural guide wires by the perimeter switch controller in response to the detection signal, thereby directing the autonomous vehicle through the doorway.

The present disclosure also teaches a method for controlling access by an autonomous vehicle, which has a magnet attached thereto, through a door in a doorway that also has a doorway device fixed thereto, where the doorway device includes a receiver and a door operating mechanism selectively operable to open and close the door, and, a magnetometer positioned a distance from the doorway, which is coupled to a transmitter corresponding to the receiver. The method includes outputting a magnetometer signal from the magnetometer to the transmitter in response to the presence of the autonomous vehicle and magnet being near the magnetometer, and, transmitting a detection signal from the transmitter in response to the magnetometer signal. And, opening the door by the doorway device for a predetermined period of time in response to receiving the detection signal, and then closing the door at the end of the predetermined period of time.

In a specific embodiment, the foregoing method further includes beginning the predetermined period of time as a function of the distance and the speed of travel of the autonomous vehicle, which is selected to open the door prior to arrival of the autonomous vehicle at the door. And, ending the predetermined period of time and closing the door after the autonomous vehicles, traveling at the speed of travel, has passed through the doorway.

In a specific embodiment of the foregoing method, where the magnetometer signal is proportional to the distance between the magnet and the magnetometer, the method further includes comparing magnetometer signals over time, thereby determining when the magnet is within twelve inches of the magnetometer, and thereby initiating the predetermined period of time.

DESCRIPTION OF THE INVENTION

Figure 1:
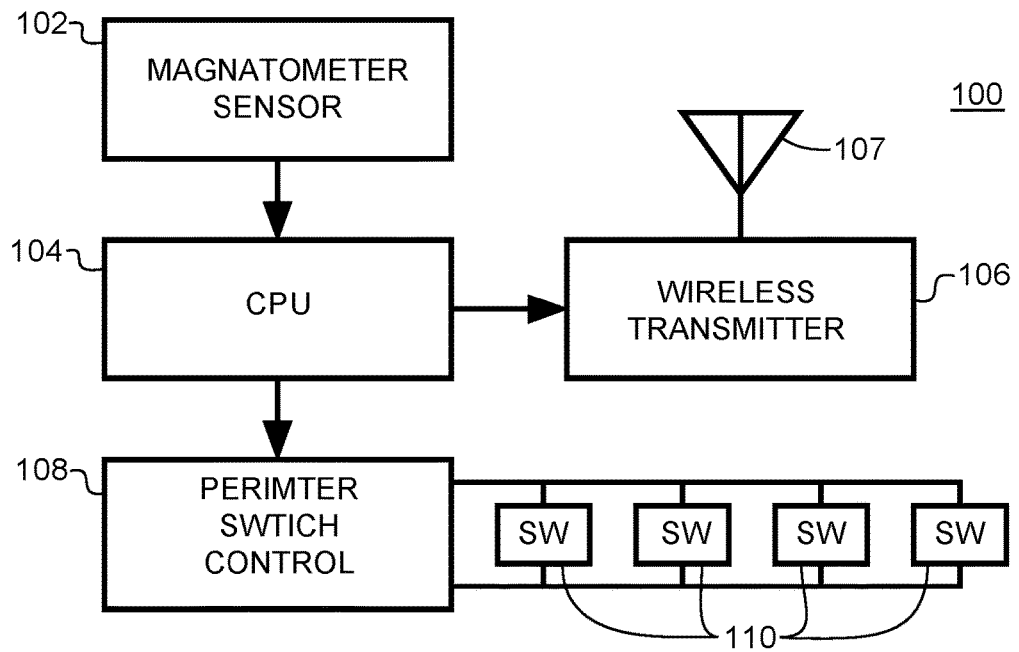
FIG. 1 is a functional block diagram of an in ground vehicle sensor system according to an illustrative embodiment of the present invention.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope hereof and additional fields in which the present invention would be of significant utility.

In considering the detailed embodiments of the present invention, it will be observed that the present invention resides primarily in combinations of steps to accomplish various methods or components to form various apparatus and systems. Accordingly, the apparatus and system components, and method steps, have been represented where appropriate by conventional symbols in the drawings, showing only those specific details that are pertinent to understanding the present invention so as not to obscure the disclosure with details that will be readily apparent to those of ordinary skill in the art having the benefit of the disclosures contained herein.

In this disclosure, relational terms such as first and second, top and bottom, upper and lower, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Those skilled in the art may implement the described functionality with alternative components for other applications.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. All structural and functional equivalents to the elements of the various configurations described throughout this disclosure that are known or become known at a later time by those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No clause element is to be construed under the provisions of 35 U.S.C. § 112, sixth paragraph, unless the element is expressly recited using the phrase "means for" or, in the case of a method clause, the element is recited using the phrase "step for."

While this written description contains many specifics, these should not be construed as limitations on the scope of what may be described, but rather as descriptions of particular embodiments of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially described as such, one or more features from a described combination can in some cases be excised from the combination, and the described combination may be directed to a sub-combination or variation of a sub-combination.

The Title, Background, Brief Description of the Drawings, Abstract, and Drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the described subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately described subject matter.

In the following detailed description, numerous specific details are set forth to provide a full understanding of the present disclosure. It will be obvious, however, to one ordinarily skilled in the art that the implementations of the present disclosure may be practiced without some of these specific details. In other instances, well-known structures and techniques have not been described in detail to avoid obscuring the disclosure.

A need exists for a system and method for detecting the presence of a robotic mower and selectively allowing the robotic mower to pass through a barrier while preventing animals, debris or intruders from passing through the barrier. In certain aspects of this disclosure, a doorway device is provided for a door in a doorway opening through a barrier. The doorway device communicates with a vehicle, selectively unlocks to allow the vehicle to pass through the door and doorway, and locks after the vehicle has passed through. In some implementations, the vehicle is a robotic lawnmower, or a robotic mower, which operates autonomously, according to a pre-set route or according to remote control. The robotic mower may be powered by electric motors and propelled by wheels and/or tracks. The robotic mower may include batteries as the source of energy or the robotic mower may be supplied with power from a central electric grid. However, embodiments disclosed are not limited to robotic lawnmowers or robotic mowers. Any type of self-propelled vehicle, including a robotic vacuum cleaner and a transportation vehicle for humans or cargo can be detected based on the disclosed embodiments, without departing from the scope of the disclosure.

The barrier may be a fence, wall, door or other obstacle. An automated doorway system of the present disclosure allows free movement of the vehicle between different areas separated by barriers, thus enabling the device to access remote grass areas, multiple grass areas, chargers and storage spaces. Absent this disclosure, it is required for an operator to manually relocate a robotic mower to allow access to areas separated by barriers. This is physically challenging, time-consuming and forces the robotic mower to rely on the availability of an operator.

In some embodiments, the vehicle may be detected using a wireless communication system. For example, the wireless communication system may include a magnetometer sensor system including a magnetometer sensor for communicating with the doorway device, and a magnet installed on the vehicle. A benefit of using the magnetometer sensor system, as disclosed herein, is that the magnetometer sensor system may detect objects, the vehicle in this case, that may not always be located at a fixed distance from magnetometer sensor system (or, more specifically, from the magnetometer sensor). In this regard, it should be noted that the position of the magnetometer sensor may be stationary, while the object to be detected may be located at substantially varying distances from the magnetometer sensor. For instance, the object to be detected may be a mobile object (e.g., vehicle 202, as discussed below) and the mobile object may take different routes that may be at different distances from the magnetometer sensor. It will thus be understood that the magnetometer sensor system, according to embodiments disclosed, may be used in any application where distances between the magnetometer sensor and the object to be detect are not fixed.

Reference is directed to FIG. 1, which illustrates an exemplary magnetometer sensor system 100. The magnetometer sensor system 100 includes a magnetometer sensor 102, a processing unit 104, a wireless transmitter 106, having an antenna 107, and a perimeter switch controller 108. The perimeter switch controller 108 is coupled to plural switching units 110 that may be used to route and reroute the perimeter wire connections (not shown). The magnetometer sensor 102 may be installed along, or adjacent to, the route taken by the robotic mower (not shown) to access the doorway, and thereby the door, as described hereinafter. In an illustrative embodiment, the magnetometer sensor 102 may be installed in the ground in or along the route taken by the mower. The processing unit 104 receives a signal from the magnetometer sensor 102 indicative of the presence of the mower in the vicinity thereof. In an example, the magnetometer sensor 102 may be configured to sense the presence of the mower within a radius of about twelve inches from the magnetometer sensor 102. The processing unit 104 may process the received signal and actuate, or otherwise control, the wireless transmitter 106 to transmit a signal to a wireless receiver (not shown) mounted on the doorway and/or door (not shown) through an antenna 107. Upon receipt of the signal, the wireless receiver (not shown) instructs a controller in the doorway device to direct a locking mechanism to retract a pin, thus unlocking a door of the doorway device and enabling the mower to pass through the doorway. This process is more fully discussed hereinafter.

Figure 4:
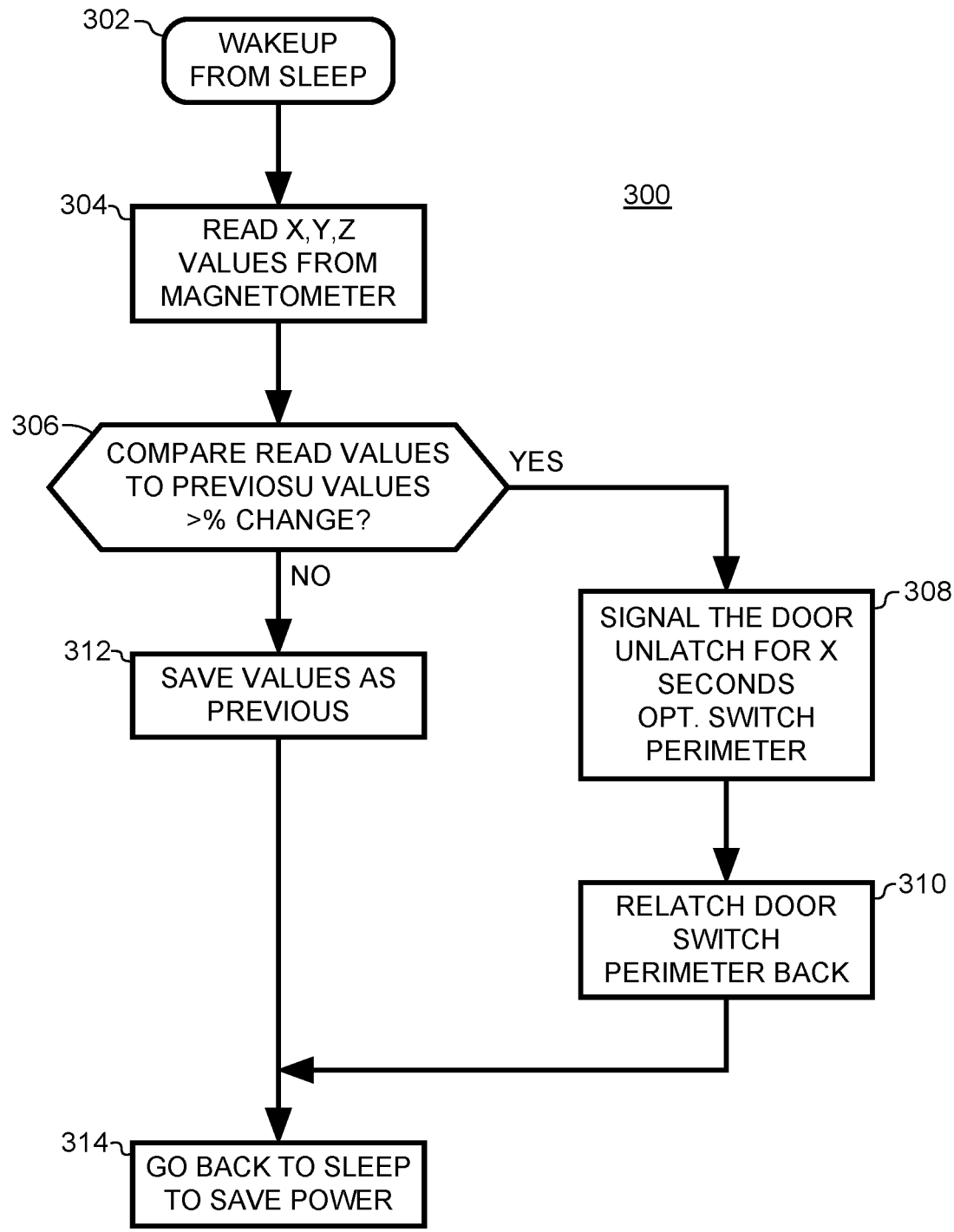
FIG. 4 is a functional block diagram of a door latch sequence according to an illustrative embodiment of the present invention.

The processing unit 104 may also process the signal received from the magnetometer sensor 102 to generate a control signal for actuating, or otherwise controlling, the perimeter switch controller 108. Generally, in order to reach a charging base, such as item 406 in FIG. 4, the robotic mower 202 in FIG. 4 is configured to follow a charged perimeter wire 402, or other conductor, buried in the ground in a loop 402 as illustrated in FIG. 4.

Figure 2:
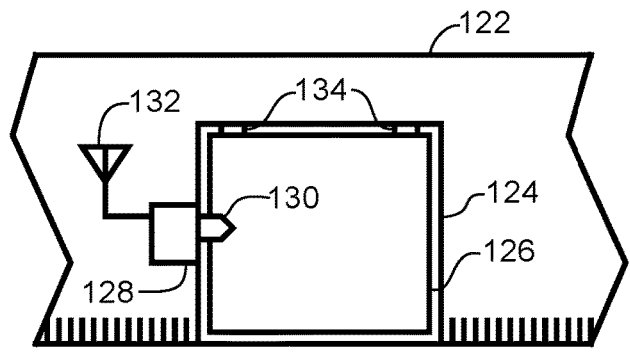
FIG. 2 is a drawing of a door in a doorway through a barrier, and with doorway device, according to an illustrative embodiment of the present invention.

No referring to FIG. 2, upon receipt of the signal transmitted by wireless transmitter 106 through its antenna 107, a wireless receiver within the doorway device 128 receives the signal through its antenna 132. This instructs a controller in the doorway device 128 to direct a locking mechanism therein to retract a pin 130, thus unlocking a door 126 in a doorway 124, that is disposed in a barrier 122, and enabling the vehicle to pass through the doorway 124. This process will be described below in greater detail.

Figure 3:
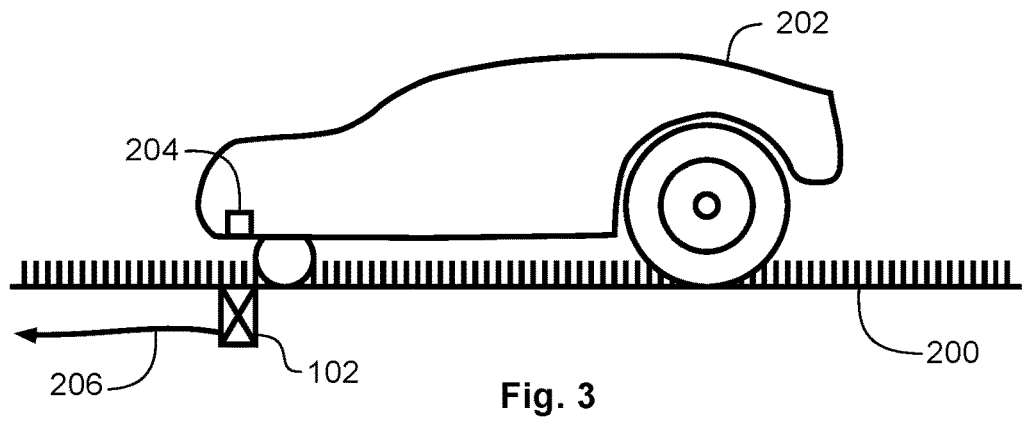
FIG. 3 is a drawing of a robotic mower engaging an in ground vehicle sensor according to an illustrative embodiment of the present invention.

In an exemplary embodiment, the magnetometer sensor 102 may be buried in the ground in the vicinity of the doorway device 128. FIG. 3 illustrates a vehicle 202 and the magnetometer sensor 102 installed in the ground. As illustrated in FIG. 3, a magnet 204, such as a rare earth magnet, is installed underneath the vehicle 202 such that the magnet 204 may be detected by the magnetometer sensor 102 buried in the ground when the magnet 204 is within a certain distance of the magnetometer sensor 102. However, the location of the magnet 204 on the vehicle 202 is not limited to a particular location, and the magnet 204 may be installed at any location on the vehicle as long as the magnet 204 is detected by the magnetometer sensor 102.

The magnetometer sensor 102 may be battery operated and may be incased in a waterproof enclosure to protect the magnetometer sensor 102. One or more other components of the magnetometer sensor system 100 may be located remote from the magnetometer sensor 102 or may be located with the magnetometer sensor 102. For instance, the processing unit 104 and the perimeter switch controller 108 may be incased in the enclosure along with the magnetometer sensor 102, while the wireless transmitter 106 may be at an above ground location. The wireless transmitter 106 may successfully send a wireless signal that is received by the wireless receiver at a certain maximum distance, which may be approximately 5-10 feet.

The processing unit 104 may be configured with the base values of the magnetic field (in the X, Y, and Z planes, referred to magnetic planes) as detected by the magnetometer sensor 102 in the absence of the magnet 204 (or, alternatively, the vehicle 202). The presence of the magnet 204 within a certain distance of the magnetometer sensor 102 may cause a change in the magnetic field detected by magnetometer sensor 102 and a corresponding signal is transmitted to the processing unit 104 indicating a change in the magnetic field and thereby the presence of the vehicle 202. In response, the processing unit 104 may command the wireless transmitter 106 to transmit a signal to the wireless receiver mounted on the doorway device 128. The door 126 in the doorway 124 may then be unlocked by the doorway device 128 such that the door is opened for the vehicle 202 to pass through.

In an embodiment, the magnetometer sensor 102 may continuously re-calibrate the magnetic plane, and thereby the base magnetic field values. As a result, a very short change (e.g., a change occurring for less than one second) in the magnetic flux because of the magnet 204 (or, alternatively, the vehicle 202) can be detected. Re-calibration may therefore limit false detection and improve sensitivity. The re-calibration may be performed at user desired time intervals (equal or unequal time), as required by the application and design.

The wireless transmitter 106 (and receiver) may use Bluetooth technology, infrared signals, ultrasonic signals, radio signals, Radio Frequency Identification, optical signals, video signals or other electronic signals for communication therebetween. The wireless transmitter 106 may be powered by the battery powering the magnetometer sensor 102, a separate battery, or a central power grid. Similarly, the wireless receiver of the doorway device may be powered by a removable auxiliary battery, a stationary high-capacity battery or a central power grid.

A distance that the magnetometer sensor 102 may be located from the doorway device may 128 be such that the doorway device opens in time for the vehicle 202 to pass therethrough. As a result, the vehicle 202 may not need to stop or decelerate for the doorway to open, thereby saving time and battery life. In an example, the distance may depend on one or more of the speed of the vehicle 202, the time taken to actuate the locking mechanism to unlock the doorway device, and the time taken for a doorway of the doorway device to open such that the vehicle may pass.

Now, considering FIG. 2 again, the doorway device 128 includes, in some implementations, the wireless receiver, the locking mechanism, engaging a door 126 disposed within a doorway 124, a controller and a battery. The locking mechanism includes a selectively positionable pin 130. In an unlocked position, the pin is retracted by the locking mechanism and does not interfere with operation of the door. The door may be a swinging door or a door with a hinge 134 located at the top of the doorway 124. In a locked position, the pin 130 is extended by the locking mechanism and is inserted into a pin receptacle in the door 126, thus preventing an operation of the door. In some implementations, the pin is longitudinally translated to the locked and unlocked, or extended and retracted, positions by a solenoid or an electric motor within the locking mechanism. A distal end of the pin, that first enters the pin receptacle in the doorway, may include a rounded, conical, pyramidal, pointed or frustum shape to aid the insertion of the pin into the pin receptacle. Additionally, in the case of the doorway being a swinging doorway with a hinge connection between the doorway and the doorway device located at the top of doorway, magnets may be disposed in the doorway and the doorway device that cooperatively encourage the doorway towards a vertical or 'closed' position, such that the pin is aligned with the pin receptacle before the pin is extended into the pin receptacle.

FIG. 4 illustrates a flowchart of a method 300 of permitting access to the vehicle 202. As illustrated, the method 300 begins with the processing unit 104 waking up from a low power sleep mode, as at 302. The processing unit 104 may check (e.g., at regular or desired pre-programmed intervals) for a signal from the magnetometer sensor 102, as at 304. Alternatively, the magnetometer sensor 102 may provide the signal to the processing unit 104 via an interrupt. In an embodiment, the signal may include the X, Y, and Z values of the magnetic field detected by the magnetometer sensor 102. In another embodiment, each of three magnetic planes X, Y, and Z may be analyzed for instability that could cause false detections. If a plane is found to continually fluctuate beyond a threshold established for detection, the plane may be ignored from the calculations. For instance, magnetic flux changes in that plane may be disregarded. As at 306, the processing unit 306 may compare the X, Y, and Z values with the stored base X, Y, and Z values and determine the difference therebetween. If the difference is above a predetermined threshold, then at 308, the processing unit may command the wireless transmitter 106 to send a signal to the wireless receiver of the doorway device to open the doorway. In an example, the doorway may be kept opened for a pre-determined time period long enough for the vehicle 202 to pass. The time period may be such that the doorway may open a short interval before the vehicle 202 passes through the barrier and may remain open a short interval after the vehicle 202 has passed. This may limit access to animals, debris or intruders.

Additionally, at 308, the processing unit 104 may command the perimeter switch controller 108 to select the appropriate switching wires. As discussed above, the switching wires may be selected by selectively activating relays connected thereto. At 310, after the pre-determined time period has expired, doorway may be closed and locked. In addition, the processing unit 104 may unselect the switching wires. At 314, the processing unit 104 may re-enter the sleep mode and the process ends.

At 306, if the difference between the X, Y, and Z values read from the magnetometer sensor 102 and the stored base X, Y, and Z values is below a pre-determined threshold, then at 312, the recently most recently received value of the magnetic field is stored and the method proceeds to 314.

Figure 5:
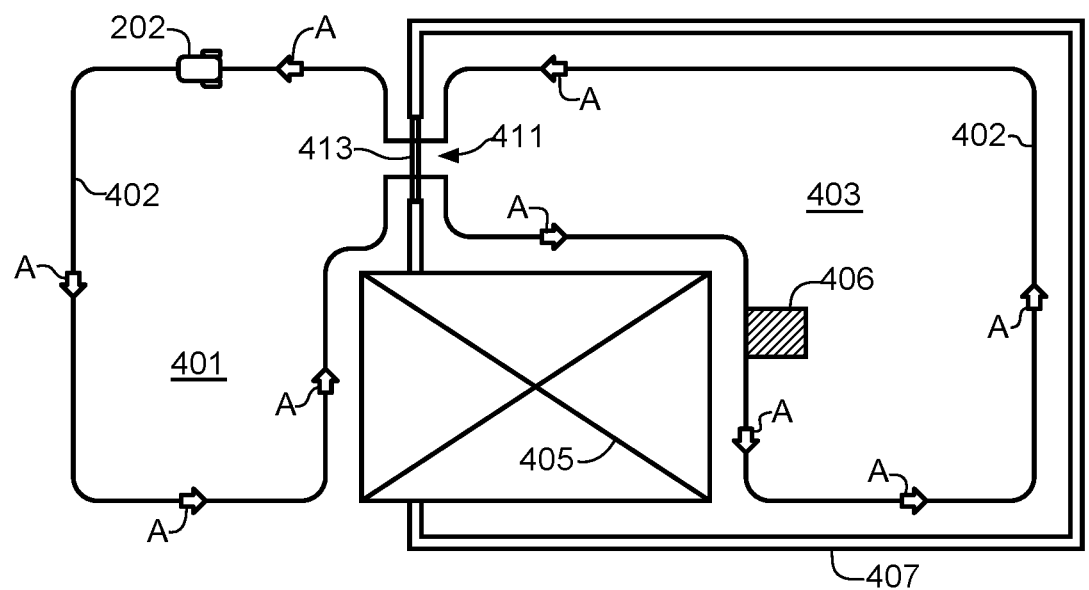
FIG. 5 is a plan view drawing of a perimeter wire arranged in a lawn areas adjacent a building, and according to an illustrative embodiment of the present invention.

Reference is directed to FIG. 5, which is a plan view drawing of a perimeter wire 402 arranged in a lawn areas adjacent a building 405, and according to an illustrative embodiment of the present invention. The perimeter wire 402 is arranged about a back lawn area 403 and a front lawn area 401. The back lawn area 403 is surrounded by a fence 407, which abuts a building 405, such as a home. There is a door opening 411 in the fence 407, and a door 413 in the doorway 411, which provided limited access between the front yard 401 and the back yard 403. The wire 402 is buried in the ground in both the back lawn area 403 and the front lawn area 401, and is arranged in a loop that extends between the front lawn area 401 and back lawn area 403 of a dwelling 405. The perimeter wire 402 may be electrically energized with a current and/or voltage flowing through the wire 402. A battery charging base 406 for charging a robotic mower 202 may be electrically connected to the wire 402 and located in the backyard 403. However, in other embodiments, the charging base 406 may be located in the front yard 401 and electrically connected to the wire 402 located in the front yard 401.

The wire 402 is used to guide an autonomous vehicle, which is robotic mower 202 in this embodiment, traveling between the front yard 401 and the backyard 403. As such, the wire 402 may be referred to as a guidance wire or a guide wire. For the purposes of discussions herein, the autonomous vehicle 202 is assumed to be a robotic lawn mower 202, also referred to as a "mower." However, as will be understood, the autonomous vehicle 202 may be any type of self-propelled vehicle, without departing from the scope of the disclosure. As indicated in FIG. 5 by the several arrows 'A', the mower 202 travels in the counterclockwise direction, as depicted, along the wire 402. However, in other embodiments, the mower 202 may travel in the clockwise direction between the front yard 401 and the backyard 403. The wire 402 passes through the doorway 411 in two directions, which are referred to as inbound and outbound directions.

The inbound and outbound wires in the loop 402 may be spaced a certain distance from each other to prevent incorrect operation due to cross-talk, interference, and the like. However, the spacing between the wires in the doorway device may be reduced due to the size of the doorway device. Additional switching wires may be connected to the perimeter wire near the doorway device to maintain the separation between the inbound and outbound wires. Based on the control signal, the perimeter switch controller 108 may be actuated to select the appropriate switches 110 such that the required separation is maintained between the inbound and outbound wires near the doorway device. The appropriate switching wires may be selected by actuating relays connected to the perimeter wire and switching wires.

In an example, the door in the doorway may not open, but may only be unlocked. Because the door is now rotationally unhindered by the pin, the vehicle 202 may proceed through the doorway by driving into the door and lifting, rotating or otherwise displacing the door. Following the passage of the vehicle through the doorway, it is ensured that the pin is properly aligned with the pin receptacle due to gravitational forces and/or other forces between the door and the doorway device. A confirmation of a proper door position can be confirmed through a Hall Effect sensor coupled to a magnet in the door and/or the doorway device. After the pre-determined time period has elapsed the processing unit directs the locking mechanism to extend the pin into the pin receptacle in the doorway, thus re-locking the doorway of the doorway device.

The disclosed systems and methods can be implemented with a computer system known to one of ordinary skill in the art, using, for example, software, hardware, or a combination of both, either in a dedicated server, or integrated into another entity, or distributed across multiple entities. An exemplary computer system includes a bus or other communication mechanism for communicating information, and a processor coupled with the bus for processing information. The processor may be locally or remotely coupled with the bus. By way of example, the computer system may be implemented with one or more processors. The processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The computer system also includes a memory, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus for storing information and instructions to be executed by processor. The instructions may be implemented according to any method well known to those of skill in the art, including, but not limited to, computer languages such as data-oriented languages (e.g., SQL, dBase), system languages (e.g., C, Objective-C, C++, Assembly), architectural languages (e.g., Java), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory may also be used for storing temporary variable or other intermediate information during execution of instructions to be executed by processor. The computer system further includes a data storage device such as a magnetic disk or optical disk, coupled to bus for storing information and instructions. The computer system may be coupled via communications module to various devices. The communications module can be any input/output module. In certain implementations, the communications module is configured to connect to a plurality of devices, such as an input device and/or an output device.

According to one aspect of the present disclosure, the disclosed system can be implemented using a computer system in response to a processor executing one or more sequences of one or more instructions contained in memory. Such instructions may be read into memory from another machine-readable medium, such as data storage device. Execution of the sequences of instructions contained in main memory causes the processor to perform the process steps described herein. One or more processors in a multi-processing arrangement may also be employed to execute the sequences of instructions contained in memory. In alternative implementations, hard-wired circuitry may be used in place of or in combination with software instructions to implement various implementations of the present disclosure. Thus, implementations of the present disclosure are not limited to any specific combination of hardware circuitry and software. According to one aspect of the disclosure, the disclosed system can be implemented using one or many remote elements in a computer system (e.g., cloud computing), such as a processor that is remote from other elements of the exemplary computer system described above.

The term "machine-readable medium" as used herein refers to any medium or media that participates in providing instructions to the processor for execution. Such a medium may take many forms, including, but not limited to, non-volatile media, volatile media, and transmission media. Non-volatile media include, for example, optical or magnetic disks, such as a data storage device. Volatile media include dynamic memory, such as memory. Transmission media include coaxial cables, copper wire, and fiber optics, including the wires that comprise the bus. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read.

The subject technology is illustrated, for example, according to various aspects described below. Various examples of aspects of the subject technology are described as numbered clauses (1, 2, 3, etc.) for convenience. These are provided as examples, and do not limit the subject technology. Some of the embodiment below are presented, for example, with reference to the several drawing figures.

One embodiment teaches a method including obtaining a magnetic field value detected by a magnetometer sensor, comparing the magnetic field value with a stored magnetic field value, transmitting a signal to actuate a doorway based on the comparison, and closing the doorway after a predetermined time period. A refinement to this embodiment teaches that the magnetic field value is obtained from a magnet located on a robotic vehicle. Another refinement to this embodiment teaches that the doorway is actuated to open when the magnetic field value is greater than a stored magnetic field value.

Another embodiment teaches that a method may be an operation, an instruction, or a function and vice versa. In one aspect, an embodiment may be amended to include some or all of the words (e.g., instructions, operations, functions, or components) recited in other one or more methods, one or more words, one or more sentences, one or more phrases, one or more paragraphs, and/or one or more embodiments.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Pronouns in the masculine (e.g., his) include the feminine and neuter gender (e.g., her and its) and vice versa. The term "some" refers to one or more. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No clause element is to be construed under the provisions of 35 U.S.C. § 112, sixth paragraph, unless the element is expressly recited using the phrase "means for" or, in the case of a method clause, the element is recited using the phrase "step for."

While this specification contains many specifics, these should not be construed as limitations on the scope of what may be described, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially described as such, one or more features from a described combination can in some cases be excised from the combination, and the described combination may be directed to a subcombination or variation of a sub combination.

The subject matter of this specification has been described in terms of particular aspects, but other aspects can be implemented and are within the scope of the clauses. For example, while operations are depicted in the drawings in a particular order, this should not be understood as requiring that such operations be performed in the particular order shown or in sequential order, or that all illustrated operations be performed, to achieve desirable results. The actions recited in the clauses can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the clauses. In addition, in the detailed description, it can be seen that the description provides illustrative examples and the various features are grouped together in various implementations for the purpose of streamlining the disclosure. The method of disclosure is not to be interpreted as reflecting an intention that the described subject matter requires more features than are expressly recited in each clause. Rather, as the clauses reflect, inventive subject matter lies in less than all features of a single disclosed configuration or operation. The clauses are hereby incorporated into the detailed description, with each clause standing on its own as a separately described subject matter.

The clauses are not intended to be limited to the aspects described herein, but are to be accorded the full scope consistent with the language clauses and to encompass all legal equivalents. Notwithstanding, none of the clauses are intended to embrace subject matter that fails to satisfy the requirements of the applicable patent law, nor should they be interpreted in such a way.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A system for controlling access by an autonomous vehicle through a door in a doorway, comprising:
   a magnet fixed to the autonomous vehicle;
   a magnetometer located a distance from the doorway, and coupled to a transmitter, and wherein said magnetometer outputs a magnetometer signal in response to said magnet, which causes said transmitter to transmit a detection signal;
   a doorway device fixed about the doorway, which further comprises a receiver corresponding to said transmitter, and a locking mechanism having a pin that is selectively extendable and retractable to lock and unlock the door, respectively, and wherein
   said doorway device retracts said pin to unlock said door for a predetermined period of time in response to receipt of said detection signal, and wherein said doorway device extents said pin to lock said door after said predetermined period of time, and wherein said predetermined period of time begins as a function of said distance and a speed of travel of the autonomous vehicle, which is selected to retract said pin prior to arrival of the autonomous vehicle at the door.

2. The system of claim 1, and wherein:

said predetermined period of time duration is selected to extend said pin after the autonomous vehicles, traveling at said speed of travel, has passed through the door.

3. The system of claim 2, and wherein the door is coupled to the doorway by a hinge, and wherein:

the autonomous vehicle engages the door and pushes it open as it passes through the doorway, and wherein said predetermined period of time is further selected to extend said pin after the door returns to a closed position.

4. The system of claim 1, and wherein:

said magnetometer signal is proportional to the distance between said magnet and said magnetometer, and wherein said magnetometer signals are compared over time to determined when said magnet is within twelve inches from said magnetometer, to thereby transmit said detection signal and initiate said predetermined period of time.

5. The system of claim 4, and wherein:

said magnetometer signal includes X, Y, and Z dimension components, and wherein said X, Y, and Z dimension components are compared over time to detect the presence of said magnet.

6. The system of claim 1, and wherein the autonomous vehicle follows plural guide wires embedded in the ground, and further comprising:

a perimeter switch controller coupled to receive said detection signal, and responsive thereto to switch among the plural guide wires to thereby direct the autonomous vehicle through the doorway.

7. The system of claim 6, and wherein:

said magnetometer is buried in the earth adjacent one of the plural guide wires that the autonomous vehicle follows.

8. A system for access control for an autonomous vehicle through a door in a doorway, comprising:

a magnet fixed to the autonomous vehicle;

a magnetometer located a distance from the doorway, and coupled to a transmitter, and wherein said magnetometer outputs a magnetometer signal in response to said magnet, which causes said transmitter to transmit a detection signal;

a doorway device fixed about the doorway, and having a receiver corresponding to said transmitter, said doorway device coupled to open the door for a predetermined period of time in response to receipt of said detection signal by said receiver, and wherein said doorway device closes the door after said predetermined period of time and wherein said magnetometer signal is proportional to the distance between said magnet and said magnetometer, and wherein said magnetometer signals are compared over time to determined when said magnet is within twelve inches from said magnetometer, to thereby transmit said detention signal and initiate said predetermined period of time.

9. The system of claim 8, and wherein:

said predetermined period of time begins as a function of said distance and a speed of travel of the autonomous vehicle, and which is selected to open the door prior to arrival of the autonomous vehicle at the door, and wherein said predetermined period of time duration is selected to close the door after the autonomous vehicle, traveling at said speed of travel, has passed through the door.

10. The system of claim 8, and wherein the autonomous vehicle follows plural guide wires embedded in the ground, and further comprising:

a perimeter switch controller coupled to receive said detection signal, and responsive thereto to switch among the plural guide wires to thereby direct the autonomous vehicle through the doorway.

11. The system of claim 10, and wherein:

said magnetometer is buried in the earth adjacent one of the plural guide wires that the autonomous vehicle follows.

12. A method for controlling access by an autonomous vehicle, having a magnet attached thereto, through a door in a doorway having a doorway device fixed thereto, the doorway device including a receiver and a locking mechanism having a selectively operable locking pin, and, a magnetometer positioned a distance from the doorway, which is coupled to a transmitter corresponding to the receiver, the method comprising the steps of:

outputting a magnetometer signal from the magnetometer to the transmitter in response to the presence of the autonomous vehicle and magnet being near the magnetometer;

transmitting a detection signal from the transmitter in response to said magnetometer signal;

retracting the locking pin by the doorway device for a predetermined period of time in response to receiving the detection signal, thereby unlocking the door, and extending the locking pin to lock the door at the end of the predetermined period of time, and wherein beginning the predetermined period of time as a function of the distance and a speed of travel of the autonomous vehicle, which is selected to retract the pin prior to arrival of the autonomous vehicle at the doorway.

13. The method of claim 12, further comprising the steps of:

ending the predetermined period of time and extending the pin to lock the door after the autonomous vehicle, traveling at the speed of travel, has passed through the doorway.

14. The method of claim 13, and wherein the door is coupled to the doorway by a hinge, further comprising the steps of:

pushing the door open by the autonomous vehicle as it passes through the doorway, and further selecting the duration of the predetermined period of time, thereby extending the pin after the door returns to a closed position.

15. The method of claim 12, wherein the magnetometer signal is proportional to the distance between the magnet and the magnetometer, and further comprising the steps of:

comparing magnetometer signals over time, thereby determining when the magnet is within twelve inches of the magnetometer, and thereby initiating the predetermined period of time.

16. The method of claim 12, and wherein the autonomous vehicle follows plural guide wires embedded in the ground, and wherein a perimeter switch controller is coupled to receive the detection signal, and further comprising the steps of:

switching among the plural guide wires by the perimeter switch controller in response to the detection signal, thereby directing the autonomous vehicle through the doorway.

17. A method for controlling access by an autonomous vehicle, having a magnet attached thereto, through a door in a doorway having a doorway device fixed thereto, the doorway device including a receiver and a door operating mechanism selectively operable to open and close the door, and, a magnetometer positioned a distance from the doorway, which is coupled to a transmitter corresponding to the receiver, the method comprising the steps of:

outputting a magnetometer signal from the magnetometer to the transmitter in response to the presence of the autonomous vehicle and magnet being near the magnetometer, wherein the magnetometer signal is proportional to the distance between the magnet and the magnetometer;

transmitting a detection signal from the transmitter in response to said magnetometer signal;

opening the door by the doorway device for a predetermined period of time in response to receiving the detection signal, and closing the door at the end of the predetermined period of time and comparing magnetometer signals over time, thereby determining when the magnet is within twelve inches of the magnetometer, and thereby initiating the predetermined period of time.

18. The method of claim 17, further comprising the steps of:

beginning the predetermined period of time as a function of the distance and a speed of travel of the autonomous vehicle, which is selected to open the door prior to arrival of the autonomous vehicle at the door, and ending the predetermined period of time and closing the door after the autonomous vehicles, traveling at the speed of travel, has passed through the doorway.

\* \* \* \* \*